(12) United States Patent
Liang et al.

(10) Patent No.: US 11,936,389 B2
(45) Date of Patent: Mar. 19, 2024

(54) DELAY LOCKED LOOPS WITH CALIBRATION FOR EXTERNAL DELAY

(71) Applicant: Analog Devices International Unlimited Company, Limerick (IE)

(72) Inventors: Siwen Liang, Basingstoke (GB); Junhua Shen, Wilmington, MA (US); Marlon Consuelo Maramba, Metro Manila (PH); Alberto Marinas, Valencia (ES); Sivanendra Selvanayagam, Abingdon (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/760,236

(22) PCT Filed: Mar. 12, 2021

(86) PCT No.: PCT/EP2021/056342
§ 371 (c)(1),
(2) Date: Aug. 5, 2022

(87) PCT Pub. No.: WO2021/180927
PCT Pub. Date: Sep. 16, 2021

(65) Prior Publication Data
US 2023/0059991 A1    Feb. 23, 2023

Related U.S. Application Data

(60) Provisional application No. 62/988,624, filed on Mar. 12, 2020.

(51) Int. Cl.
*H03L 7/081* (2006.01)
*G01S 7/4865* (2020.01)
*G04F 10/00* (2006.01)

(52) U.S. Cl.
CPC .......... *H03L 7/0812* (2013.01); *G01S 7/4865* (2013.01); *G04F 10/005* (2013.01)

(58) Field of Classification Search
CPC ..... H03L 7/0812; G01S 7/4865; G04F 10/005
See application file for complete search history.

(56) References Cited

U.S. PATENT DOCUMENTS

| | | | |
|---|---|---|---|
| 6,377,093 B1 | 4/2002 | Lee et al. | |
| 6,771,103 B2 | 8/2004 | Watanabe et al. | |

(Continued)

FOREIGN PATENT DOCUMENTS

| | | | |
|---|---|---|---|
| CN | 109884652 A | | 6/2019 |
| CN | 112558519 A | * | 3/2021 |

(Continued)

OTHER PUBLICATIONS

International Search Report and Written Opinion for International Application No. PCT/EP2021/056342 dated Jun. 16, 2021 in 10 pages.

(Continued)

*Primary Examiner* — Adam D Houston
(74) *Attorney, Agent, or Firm* — Knobbe, Martens, Olson & Bear, LLP

(57) ABSTRACT

Provided herein are delay locked loops (DLLs) with calibration for external delay. In certain embodiments, a timing alignment system includes a DLL including a detector that generates a delay control signal based on comparing a reference clock signal to a feedback clock signal, and a controllable delay line configured to generate the feedback clock signal by delaying the reference clock signal based on the delay control signal. The timing alignment system further includes a delay compensation circuit that provides an adjustment to the controllable delay line to compensate for a delay of the feedback clock signal in reaching the detector.

20 Claims, 15 Drawing Sheets

(56) References Cited

U.S. PATENT DOCUMENTS

| | | | |
|---|---|---|---|
| 7,111,185 B2 | 9/2006 | Gomm et al. | |
| 7,486,757 B2 | 2/2009 | Kim et al. | |
| 7,667,633 B2 | 2/2010 | Choi et al. | |
| 8,164,063 B2 | 4/2012 | Frach et al. | |
| 8,471,754 B2 | 6/2013 | Yamamoto et al. | |
| 9,109,888 B2 | 8/2015 | Korekado et al. | |
| 9,564,190 B2 | 2/2017 | Jung | |
| 10,677,648 B2* | 6/2020 | Ikuta | G01S 7/4861 |
| 11,177,816 B2* | 11/2021 | Weeks | G06F 1/10 |
| 2004/0160254 A1 | 8/2004 | Okajima | |
| 2008/0100357 A1* | 5/2008 | Bae | H03L 7/0814 |
| | | | 327/158 |
| 2010/0277158 A1 | 11/2010 | Lee et al. | |
| 2012/0049914 A1* | 3/2012 | Pellerano | H03L 7/1974 |
| | | | 327/158 |
| 2018/0054206 A1 | 2/2018 | Im et al. | |
| 2018/0091159 A1* | 3/2018 | Tsutsumi | H03K 5/135 |
| 2018/0102407 A1 | 4/2018 | Moore et al. | |
| 2020/0076439 A1* | 3/2020 | Weeks | H03L 7/0805 |
| 2020/0292616 A1 | 9/2020 | Conklin et al. | |
| 2020/0363506 A1 | 11/2020 | Shen et al. | |
| 2021/0288653 A1 | 9/2021 | Liang et al. | |
| 2022/0247390 A1* | 8/2022 | Kim | H03L 7/0814 |
| 2023/0107400 A1* | 4/2023 | Liang | H03K 5/26 |
| | | | 356/5.01 |

FOREIGN PATENT DOCUMENTS

| | | | | |
|---|---|---|---|---|
| EP | 3 306 819 A1 | | 4/2018 | |
| EP | 3739358 A1 | * | 11/2020 | G01S 17/08 |
| JP | 2016129369 A | | 7/2016 | |
| KR | 20100040412 A | * | 4/2010 | |
| KR | 20220039167 A | * | 3/2022 | |
| WO | WO 03/088485 A1 | | 10/2003 | |
| WO | WO-2021180927 A1 | * | 9/2021 | G01S 7/4865 |

OTHER PUBLICATIONS

Chuang, Li-Pu, "An All-Digital Fast-Lock Self-Calibrated Multiphase DLL" A Thesis Submitted to Department of Electronics Engineering & Institute of Electronics College of Electrical Engineering and Computer Engineering National Chiao Tung University dated Jul. 2008, in 94 pages.

Maneatis, J. G., "Low-jitter and process independent DLL and PLL based on self biased techniques," in IEEE International Solid-State Circuits Conference, San Francisco, 1996, in 3 pages.

Rhee, Woogeun, "Design of high-performance CMOS charge pumps in phase-locked loops," in Circuits and Systems, 1999. ISCAS '99. Proceedings of the 1999 IEEE International Symposium on, Orlando, FL, 1999, in 4 pages.

* cited by examiner

DELAY LOCKED LOOPS WITH CALIBRATION FOR EXTERNAL DELAY

FIELD OF THE DISCLOSURE

Embodiments of the invention relate to electronic systems, and more particularly to, delay locked loops (DLLs).

BACKGROUND

Delay locked loops (DLLs) operate with feedback to phase lock an output signal to an input signal. In contrast to phase locked loops (PLLs) in which feedback sets the oscillation frequency of a controllable oscillator, DLLs use feedback to set a delay of a controllable delay line to lock the output signal to the input signal. DLLs offer lower sensitivity to supply noise and/or lower phase noise relative to PLLs.

DLLs can be used in a wide variety of applications including, but not limited to, timing alignment, clock and data recovery, and/or clock generation.

SUMMARY OF THE DISCLOSURE

Provided herein are delay locked loops (DLLs) with calibration for external delay. In certain embodiments, a timing alignment system includes a DLL including a detector that generates a delay control signal based on comparing a reference clock signal to a feedback clock signal, and a controllable delay line configured to generate the feedback clock signal by delaying the reference clock signal based on the delay control signal. The timing alignment system further includes a delay compensation circuit that provides an adjustment to the controllable delay line to compensate for a delay of the feedback clock signal in reaching the detector. For example, in certain implementations, the feedback clock signal propagates through an external delay circuit to reach the detector. Additionally, the external delay compensation circuit can measure a delay through the external delay circuit, and adjust the controllable delay line based on the measured delay to provide delay compensation. Absent compensation for external delay, a DLL may not operate over a full range of operating constraints and/or suffer from extensive design constraints and/or trade-offs. Furthermore, such delay compensation reduces or eliminates an amount of laboratory efforts for characterization, evaluation, and/or test.

In one aspect, a timing alignment system with calibration for loop delay is provided. The timing alignment system includes a delay locked loop (DLL) including a detector configured to generate a delay control signal based on comparing a reference clock signal to a feedback clock signal, and a controllable delay line configured to generate the feedback clock signal by delaying the reference clock signal based on the delay control signal. The timing alignment system further includes a delay compensation circuit configured to provide an adjustment to the controllable delay line to compensate for a delay of the feedback clock signal in reaching the detector.

In another aspect, a method of calibration for external delay in a timing alignment system is provided. The method includes generating a delay control signal based on comparing a reference clock signal to a feedback clock signal using a detector of a delay locked loop (DLL), generating the feedback clock signal by delaying the reference clock signal based on the delay control signal using a controllable delay line of the DLL, and providing an adjustment to the controllable delay line to compensate for a delay of the feedback clock signal in reaching the detector using a delay compensation circuit.

In another aspect, a time of flight system includes a receiver configured to provide a reference clock signal, a driver circuit configured to generate a driver signal, and a timing alignment system comprising a delay-locked loop configured to control timing of the driver signal based on the reference clock signal. The delay-locked loop includes a detector configured to generate a delay control signal based on comparing a reference clock signal to a feedback clock signal, and a controllable delay line configured to generate the feedback clock signal by delaying the reference clock signal based on the delay control signal. The timing alignment system further includes a delay compensation circuit configured to provide an adjustment to the controllable delay line to compensate for a delay of the feedback clock signal in reaching the detector.

DETAILED DESCRIPTION

Figure 1A:
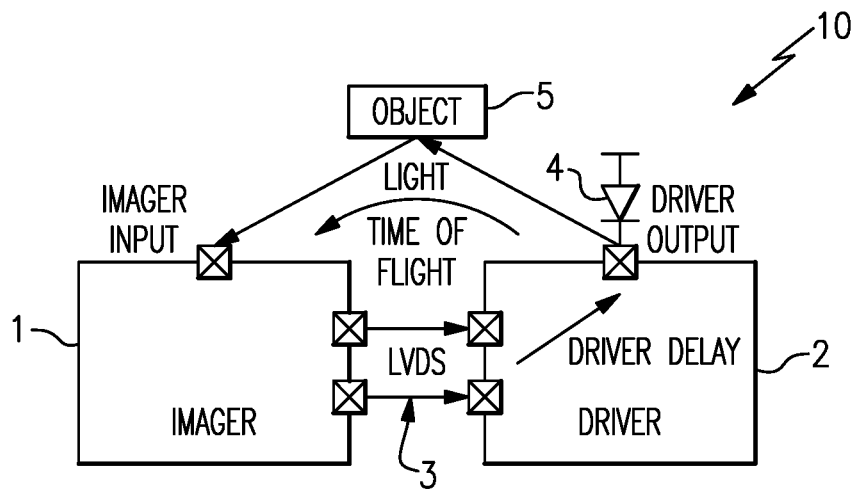
FIG. 1A is a schematic diagram of a time of flight system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Provided herein are delay locked loops (DLLs) with calibration for external delay. In certain embodiments, a timing alignment system includes a DLL including a detector that generates a delay control signal based on comparing a reference clock signal to a feedback clock signal, and a controllable delay line configured to generate the feedback clock signal by delaying the reference clock signal based on the delay control signal. The timing alignment system further includes a delay compensation circuit that provides an adjustment to the controllable delay line to compensate for a delay of the feedback clock signal in reaching the detector.

For example, in certain implementations, the feedback clock signal propagates through an external delay circuit to reach the detector. Additionally, the external delay compensation circuit can measure a delay through the external delay circuit, and adjust the controllable delay line based on the measured delay to provide delay compensation.

Absent compensation for external delay, a DLL may not operate over a full range of operating constraints and/or suffer from extensive design constraints and/or trade-offs. Furthermore, such delay compensation reduces or eliminates an amount of laboratory efforts for characterization, evaluation, and/or test.

The delay compensation systems herein can be used in a wide range of applications.

In one specific example, delay compensation can be used for one or more DLLs used in a time of flight (ToF) application. Time of flight measurement techniques are attractive for a wide range of emerging 3D imaging applications including, but not limited to, facial recognition, augmented reality, machine vision, industrial automation and/or autonomous driving.

Although delay compensation can be used in time of flight systems, the teachings herein are applicable to a wide range of timing alignment systems.

Figure 1B:
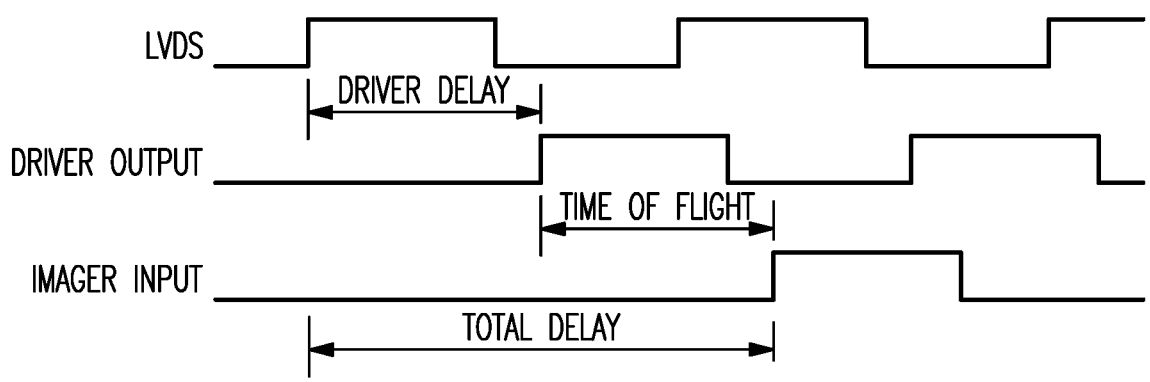
FIG. 1B is one example of a timing diagram for the time of flight system of FIG. 1A.

FIG. 1A is a schematic diagram of a time of flight system 10 according to one embodiment. FIG. 1B is one example of a timing diagram for the time of flight system 10 of FIG. 1A.

The time of flight system 10 includes a two-chip architecture including an imager chip 1 and a laser driver chip 2 connected by an interface (low-voltage differential signaling or LVDS, in this example). The imager chip 1 serves as a master chip that sends a signal pulse (for instance, an LVDS signal) to the laser driver chip 2.

The laser driver chip 2 controls emission of light output (using light emitting element 4, in this example) to an object 5, and the reflected light arrives at the receiver of the imager chip 1 sometime later. The light emitting element 4 can correspond to a wide variety of light emitting components including, but not limited to, a laser emitting element such as a vertical-cavity surface-emitting laser (VCSEL).

The imager chip 1 then calculates the distance to the object 5 by measuring the time or phase difference between the transmitted LVDS signal and the reflected light, with knowledge of the speed of light. The total delay (see FIG. 1B) is the sum of the driver's own propagation delay and the actual time of flight. The driver delay is typically calibrated out for each part at a certain temperature and voltage. However, it is complicated and costly to calibrate its drift over temperature and voltage, reducing its market viability.

Figure 2:
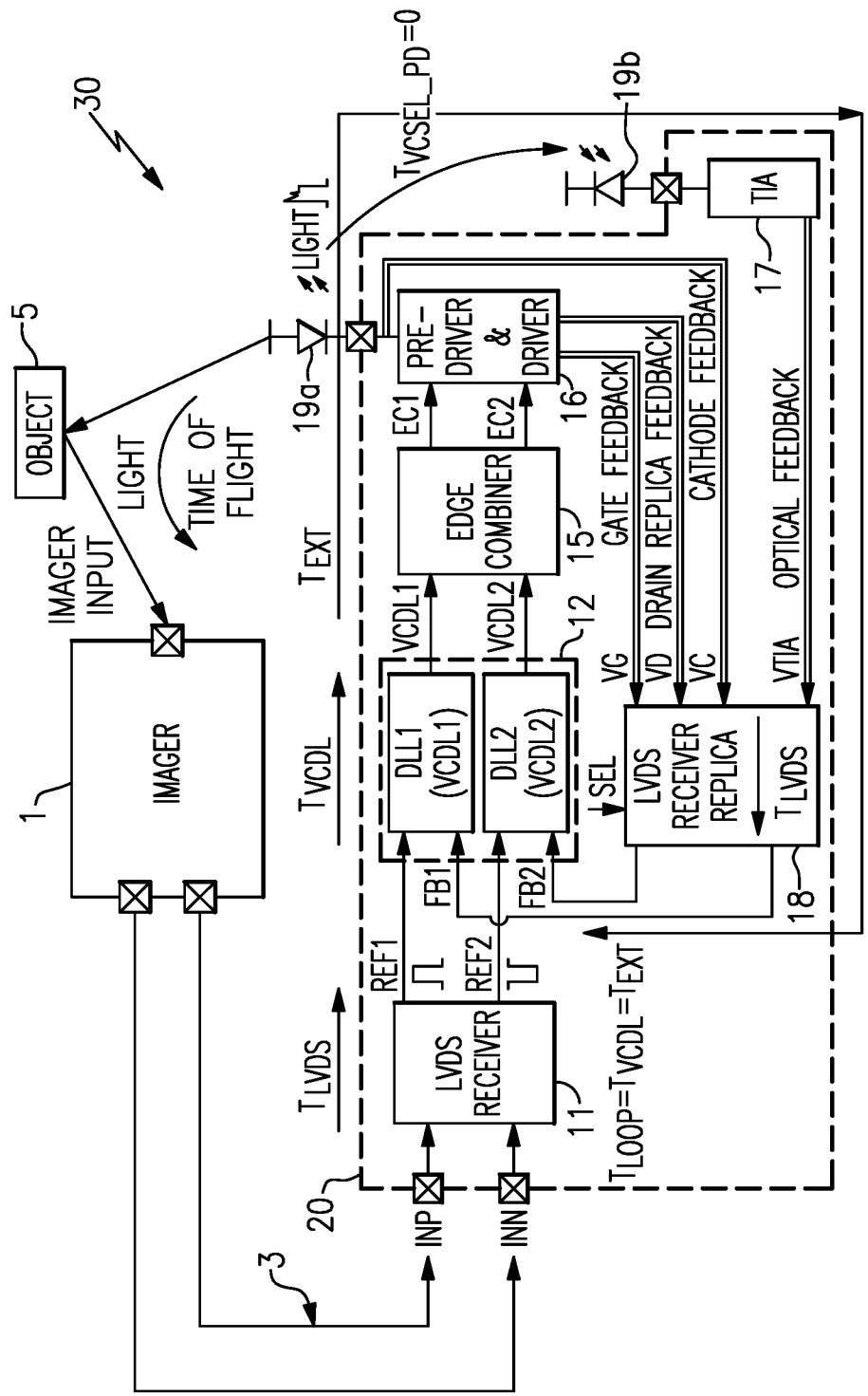
FIG. 2 is a schematic diagram of a time of flight system according to another embodiment.

FIG. 2 is a schematic diagram of a time of flight system 30 according to another embodiment. The time of flight system 30 of FIG. 2 includes an imager chip 1 and a laser driver chip 20 connected by an interface 3.

The time of flight system 30 of FIG. 2 is similar to the time of flight system of 10 of FIG. 1A except that the time of flight system 30 depicts a specific implementation of laser driver circuitry.

In particular, the laser driver chip 20 of FIG. 2 includes a receiver 11, a pair of DLLs 12, an edge combiner 15, a driver signal chain (pre-driver/driver circuitry) 16, a transimpedance amplifier (TIA) 17, and a replica receiver 18 operating on various feedback options (for instance, gate/drain replica/cathode/TIA). The laser driver chip 20 is coupled to a transmitting light element 19a and to a receiving light element 19b. For the TIA path (corresponding to an optical feedback option), the laser driver chip 20 uses a feedback path utilizing the transmitting light element 19a and the receiving light element 19b. The time of flight from the transmitting light element 19a to the receiving light element 19b is negligible (for instance, $T_{VCSEL\_PD}$ about equal to 0 ns) because they are normally placed very close together in a module.

In the illustrated embodiment, the pair of DLLs 12 are used to align both the rising and falling edges of the output to the input signal, regardless if the signal itself is single-ended or differential. The loop forces the input signal (INP, INN) to be aligned with one of the selected feedback signals (VG, VD, VC, VTIA). In certain implementations, the laser driver chip 20 is further implemented with calibration for variation in one or more of the gate/drain replica/cathode/TIA nodes.

The pair of DLLs 12 operate as part of a dual DLL timing alignment system for controlling timing of the emission of light from the time of flight system 30.

In certain implementations, the dual DLL timing alignment system supports one or more of the following performance specifications: (1) alignment of both the output rising and falling edges to the input signal; (2) support of wide range frequency and multiple feedback options and corresponding support for a large amount of combinations of signal period and external delay ($T_{EXT}$), corresponding to the propagation delay around the loop outside the DLL's voltage controlled delay line (VCDL); (3) signal must reliably propagate through multiple input signal periods; (4) low alignment phase error drift over temperature and supply; (5) well controlled bandwidth for fast locking/spread spectrum purpose; and/or (6) good tuning range to track $T_{EXT}$ delay variation (for instance, due to laser diode driver's self-heating).

The dual DLL timing alignment system of FIG. 2 can operate with a relatively long length of $T_{EXT}$ compared with the input reference signal period $T_{REF}$.

In certain implementations, a dual DLL timing alignment system is implemented in accordance with one or more of the calibration schemes disclosed herein. For example, either or both of the depicted DLLs can be implemented with self-calibration for an external delay path to the DLL, thereby enabling robust operation of the DLL and ensuring low risk, low engineering cost, and/or fast time to market.

Although FIG. 2 depicts a dual DLL timing alignment system that can be implemented with calibration for external delay of a DLL, the teachings herein are also applicable to other DLL systems, including single DLL systems.

Figure 3A:
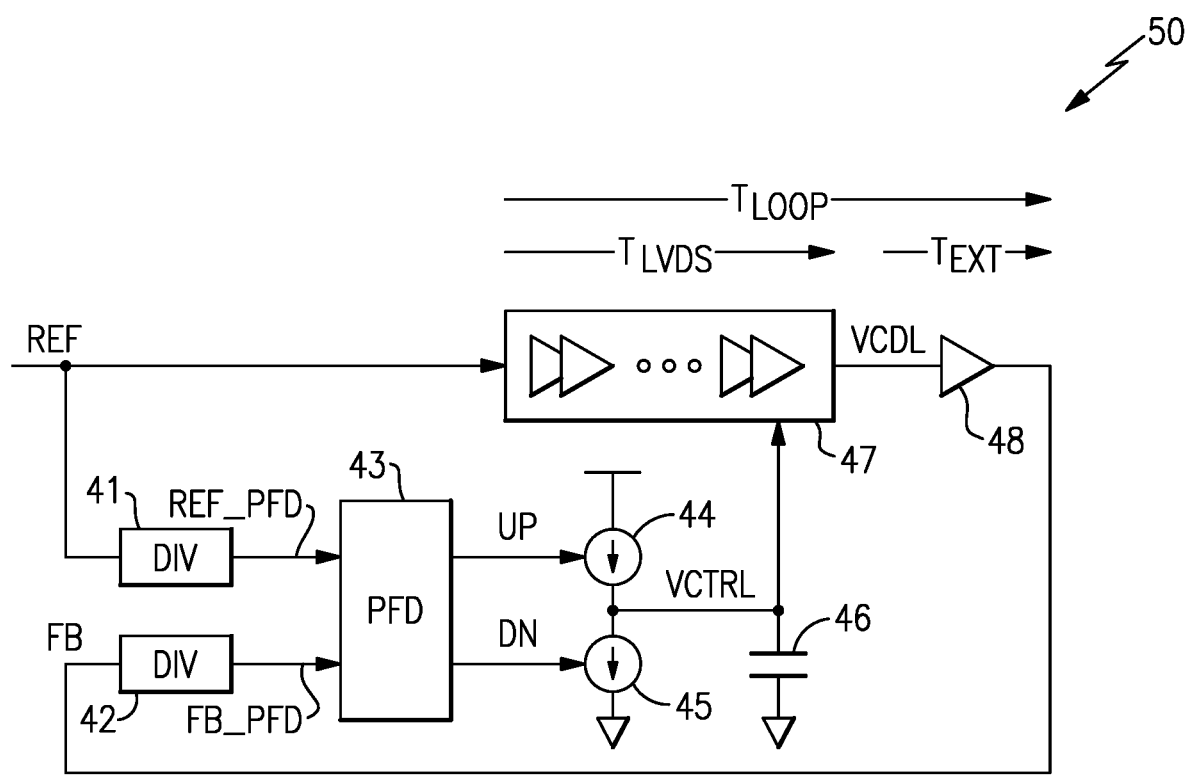
FIG. 3A is a schematic diagram of an example implementation of a DLL.

FIG. 3A is a schematic diagram of an example implementation of a DLL 50. The DLL 50 includes a reference divider 41, a feedback divider 42, a phase frequency detector (PFD) 43, an up current source 44, a down current source 45, a loop capacitor 46, a voltage controlled delay line 47, and an output buffer 48.

As shown in FIG. 3A, a reference signal REF is provided to the voltage-controlled delay line 47 and to the reference divider 41, which divides the reference signal REF to generate a PFD reference signal REF_PFD. The PFD 43 compares the PFD reference signal REF_PFD to a PFD feedback signal FB_PFD to generate an up signal UP for controlling the up current source 44 and a down signal DN for controlling the down current source 45. The up current source 44 and the down current source 45 provide currents to the loop capacitor 46 to thereby set a control voltage VCTRL (also referred to herein as a loop voltage) for controlling a delay of the voltage controlled delay line 47. The voltage controlled delay line 47 delays the reference signal REF to generate a delayed output signal VCDL, which is buffered by the output buffer 48 to generate a feedback signal FB. The feedback divider 42 divides the feedback signal FB to generate the PFD feedback signal FB_PFD.

The DLL 50 is annotated to include various delays including a VCDL delay ($T_{VCDL}$), an external delay ($T_{EXT}$), and a total loop delay ($T_{LOOP}$).

Figure 3B:
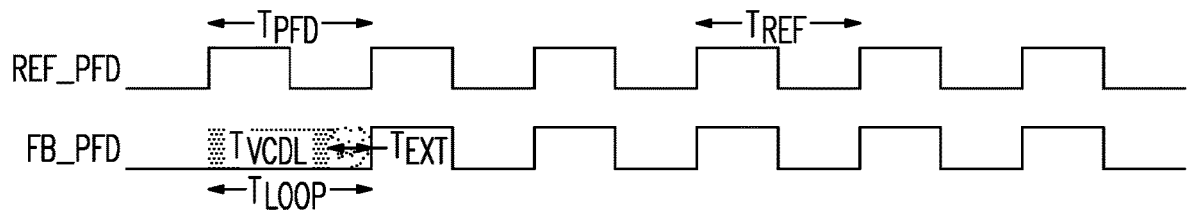
FIG. 3B is a first example of a timing diagram for the DLL of FIG. 3A.

Typical DLLs operate with $T_{EXT}$ that is always shorter or much shorter than $T_{REF}$ as shown in FIG. 3B.

Figure 3C:
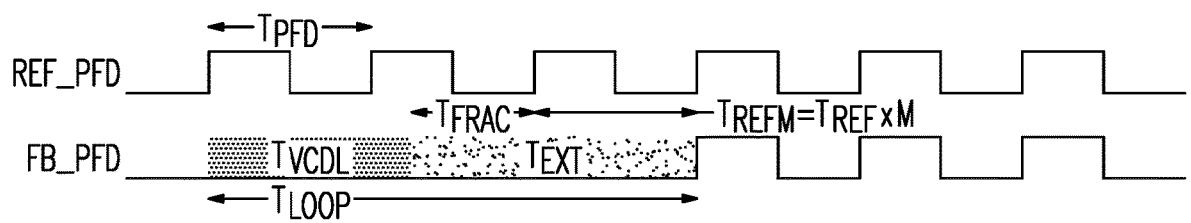
FIG. 3C is a second example of a timing diagram for the DLL of FIG. 3A.
Figure 3D:
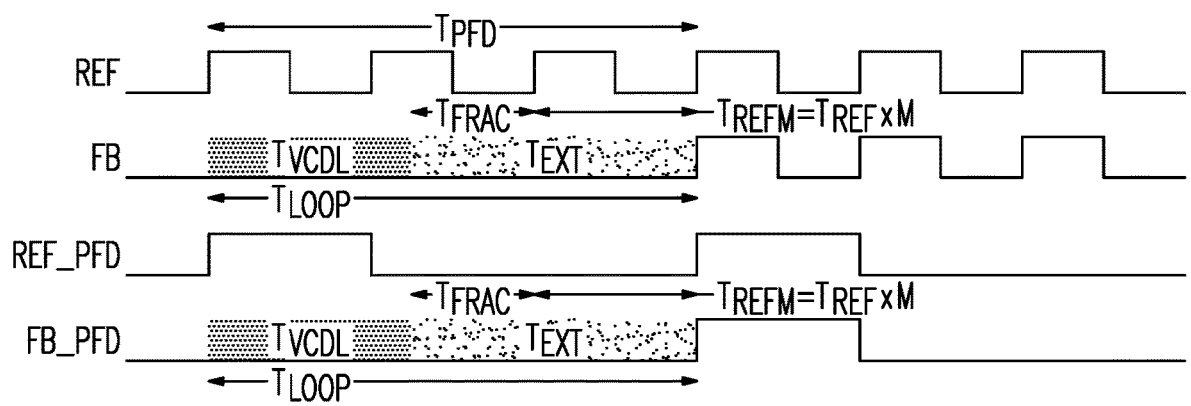
FIG. 3D is a third example of a timing diagram for the DLL of FIG. 3A.

In the context of certain DLL applications, such as the dual DLL timing alignment system of FIG. 2, $T_{EXT}$ is not very well defined. It can be shorter or longer than $T_{REF}$. In general, we could see the length of $T_{EXT}$ as an integer multiple of the reference periods, $T_{REFM}=T_{REF} \times M$ (M=0, 1, 2 ...), plus a fraction of the reference period, $T_{FRAC}$. FIG. 3C and FIG. 3D show two examples of possible alignment diagrams. Note that $T_{PFD}$ could be a multiple of $T_{REF}$ when the division ratio of the frequency divider is greater than one. Although various alignment diagrams are depicted, other scenarios are possible, including, but not limited to, scenarios in which $T_{PFD}$ is greater than the total time length.

Absent compensation, large variations in $T_{EXT}$ can lead to a number of operating issues in a DLL. For example, without compensation, variation in $T_{EXT}$ can lead to one or more of the following: (1) difficulty in partitioning the VCDL delay ($T_{VCDL}$), the external delay ($T_{EXT}$) and/or frequency division ratio for all the combinations of signal frequency and use case over process, voltage and temperature (PVT) variation to guarantee the functionality and performance robustly, particularly with poorly defined $T_{EXT}$; (2) runt pulses or disappearing signal issues when the loop forces the VCDL's unit cell delay, $T_{TAP}$, to be too long; (3) targeted $T_{TAP}$ could be shorter than the VCDL's minimum delay such that the DLL is falsely locked; (4) forcing the charge pump into a non-ideal operating point associated with increased alignment phase error; (5) out of control loop bandwidth; and/or (6) malfunctioning during phase acquisition resulting in no lock in some certain scenarios (for instance, based on the relationship between $T_{EXT}$, $T_{VCDL}$ and $T_{PFD}$).

Figure 4:
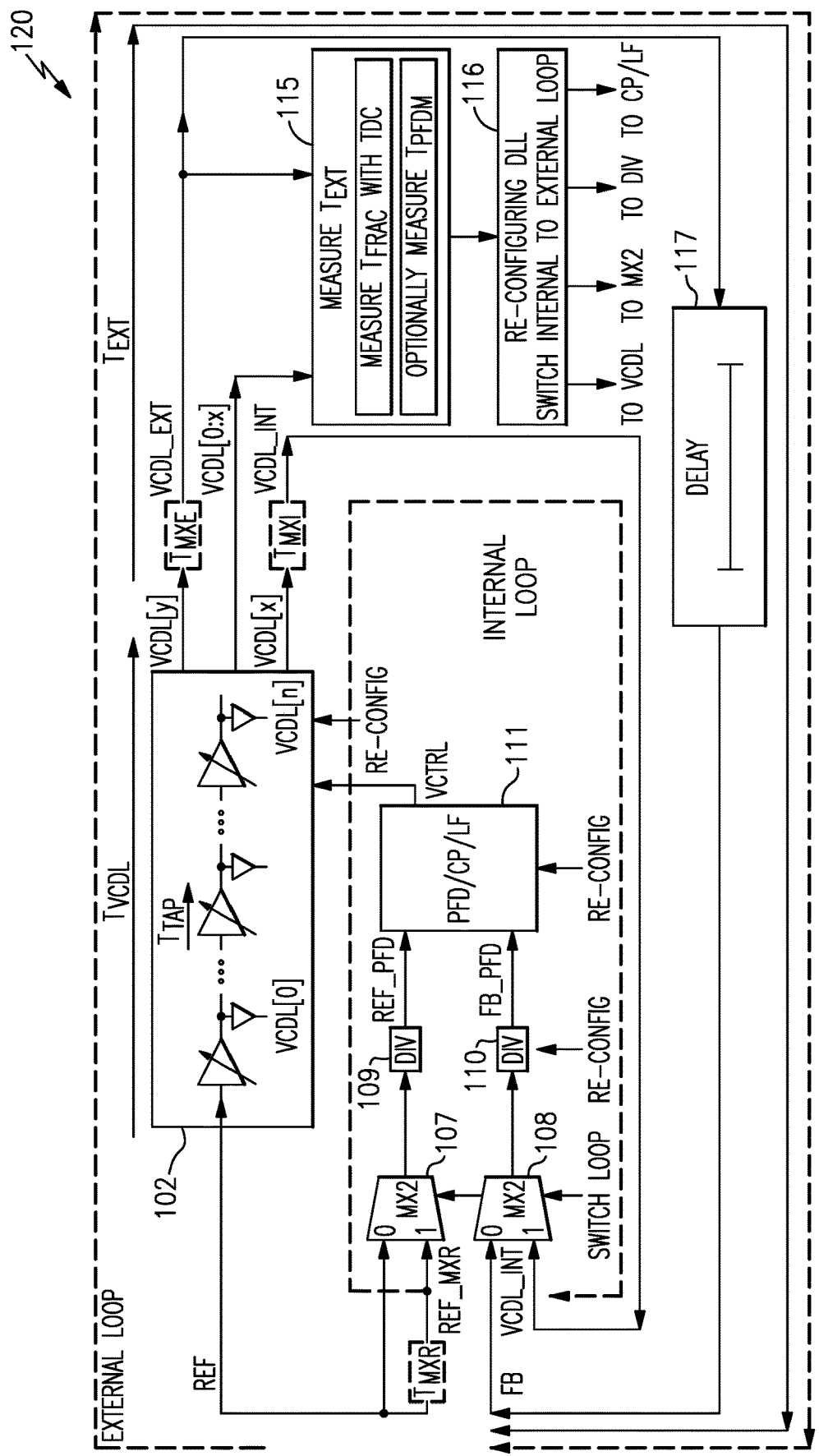
FIG. 4 is a schematic diagram of a DLL with calibration according to one embodiment.

FIG. 4 is a schematic diagram of a DLL 120 with calibration according to one embodiment. The DLL 120 of FIG. 4 is implemented with a TDC-based self-calibration scheme to ensure robust operation of the DLL over a wide range of performance requirements. The DLL 120 is implemented with single edge locking, in this example. However, the teachings herein are also applicable to DLLs implemented with dual edge locking.

In the illustrated embodiment, the DLL 120 includes a VCDL 102, a reference clock multiplexer 107, a feedback clock multiplexer 108, a reference divider 109, a feedback divider 110, a PFD/CP/LF 111, a delay measurement circuit 115, a DLL reconfiguration circuit 116, and a delay circuit 117. Although one example of a DLL is shown, the teachings herein are applicable to DLLs implemented in a wide variety of ways including to other implementations of analog DLLs as well as to digital DLLs. Accordingly, other implementations of DLLs are possible.

As shown in FIG. 4, the DLL 120 has been annotated with various delays including a delay $T_{VCDL}$ through the VCDL 102 and a delay $T_{EXT}$ from the output of the VCDL 102 to an input of the feedback clock multiplexer 108.

In the illustrated embodiment, the delay measurement circuit 115 measures the delay $T_{EXT}$ using a TDC, as will be discussed in detail further below. Additionally, the DLL 120 is reconfigured (including an adjustment to the VCDL 102) to account for the delay $T_{EXT}$ using the DLL reconfiguration circuit 116.

Thus, the DLL 120 of FIG. 4 provides calibration for $T_{EXT}$ such that the VCDL 102 and the charge pump (within the PDF/CP/LF 111) operate around a desired operation point regardless the length of $T_{EXT}$ compared with a reference period $T_{REF}$ of the DLL's reference clock REF, thereby ensuring robustness and compliance with phase error, bandwidth, and/or flexibility specifications. Thus, $T_{EXT}$ is calibrated such that the impact of $T_{EXT}$ is trimmed out and the DLL 120 operates similar to a DLL operating without an external loop. For example, after calibration, in certain implementations the DLL 120 can operate as if $T_{EXT}$ is about 0 ns.

Moreover, the self-calibration alleviates a need for an end user (for instance, characterization, evaluation, test program, and/or customer) to manually configure the DLL's loop to account for external delay. Furthermore, the self-calibration allows a DLL design (for instance, the DLL's circuit blocks) to be migrated to a new design with low engineering cost and risk and/or short time to market by avoiding a need for custom DLL design tweaks to account for a particular external delays associated with the new design. In addition, when used in the context of a dual DLL timing alignment systems, the risk of dual loop malfunction acquisition is eliminated.

In certain embodiments, calibration is performed by first configuring the VCDL output (VCDL[x]) as the feedback input of the detector (a PFD, in this example) to form the internal loop, and allowing it to lock. For example, the feedback could be taken from VCDL_INT with the propagation delay of $T_{MXI}$, which could represent a delay of a multiplexer, additional buffer, and/or other circuit, with a matching propagation delay of $T_{MXR}$ included in the reference path for enhanced delay matching.

Once locked, the VCDL tap output edges can be evenly distributed over one PFD reference period, for instance, $T_{VCDL[x]} \approx T_{PFD} \approx T_{TAP}*(x+1)$, where $T_{VCDL[x]}$ means the VCDL output is taken from VCDL[x]. The value of x could be an integer between 0 and n. When locking the internal DLL, $T_{PFD}$ can be equal to or a multiple of $T_{REF}$ (for instance, based on a division value between the reference and the input to the PFD).

Secondly, calibration continues by measuring at least a fractional portion ($T_{FRAC}$) of an actual external delay $T_{EXT}$ from VCDL[y] to a feedback (FB) node when the internal loop is locked or close to lock. For example, actual external delay $T_{EXT}$ can correspond to an integer number (0, 1, 2, etc.) of periods of the PFD reference period plus $T_{FRAC}$. In certain implementations, $T_{FRAC}$ can be measured using a TDC of which the references are taken from the VCDL tap outputs (VCDL[0:x]). Additionally, VCDL[y] could be the same as VCDL[x] in this step so that $T_{LOOP}=T_{VCDL[x]}+T_{EXT}=T_{VCDL[y]}+T_{EXT}$. $T_{LOOP}$ can be of any length at this stage. Moreover, $T_{REFM}$ can also be measured in certain implementations.

Thirdly, once at least the fractional portion ($T_{FRAC}$) of $T_{EXT}$ is known, the VCDL 102 of the DLL 120 is reconfigured/adjusted such that the new $T_{LOOP}$, which is the new $T_{VCDL[y]}$ plus the unchanged $T_{EXT}$, is about equal to an integer multiple of $T_{PFD}$. Thereafter the DLL's loop is switched or transitioned by bringing the actual feedback point to the PFD input to form the external loop and allow it to lock.

In certain implementations, the loop bandwidth of the DLL is also adjusted to account for the adjustment to the VDCL length. For example, the loop bandwidth of the DLL can be changed (for instance, by adjusting a strength of a charge pump current and/or a capacitance of a loop filter) to maintain the calibrated VCDL's control voltage (VCTRL) close to that of the internal loop, for instance, $T_{TAP}$ has enough margin to increase or decrease and charge pump performance is well controlled.

To reconfigure the VCDL 102, the number of taps of the VCDL could be increased or decreased (for instance, the value of y can be greater or smaller than x), which could involve using a multiplexer with propagation delay of $T_{MXE}$. Additionally, or alternatively, $T_{VCDL}$ can be adjusted by changing the VCDL's bias current, load capacitance, and/or by using an inversion phase of the VCDL taps. The teachings herein are applicable to any suitable manner of reconfiguring a VCDL.

Moreover, the frequency divider ratio of a divider (for example, the feedback divider 110) can be changed during calibration (effectively changing $T_{PFD}$) so that the external loop's $T_{PFD}$ is equal or longer than $T_{LOOP}$. The information of $T_{LOOP}$ could be based on the accurately measured $T_{REFM}$ and/or $T_{FRAC}$, or rough estimation.

Furthermore, since, reconfiguring the VCDL length and/or $T_{PFD}$ may change the loop bandwidth of the DLL 120, the loop bandwidth can also be adjusted (for instance, by reconfiguring the charge pump and/or loop filter) to compensate for this. Moreover, the charge pump could be biased using the control voltage VCTRL to further control the loop bandwidth.

For dual DLL operation (for instance, the dual DLL timing alignment system of FIG. 2), each DLL could go through such internal loop locking and $T_{EXT}$ measurement independently. Thus, when switching to the external loops, both DLLs will start from close to lock position.

By providing calibration in this manner, a universal methodology is provided for external delay measurement and compensation of a DLL. Absent compensation for external delay, a DLL may not operate over a full range of operating constraints and/or suffer from extensive design constraints and/or trade-offs made with the hope of improving robustness and performance. Furthermore, such compensation reduces or eliminates an amount of laboratory efforts for characterization, evaluation, and/or test.

Figure 5A:
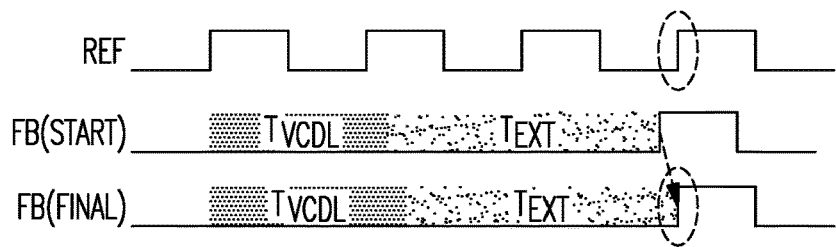
FIG. 5A is a first example of a timing diagram for a DLL.
Figure 5B:
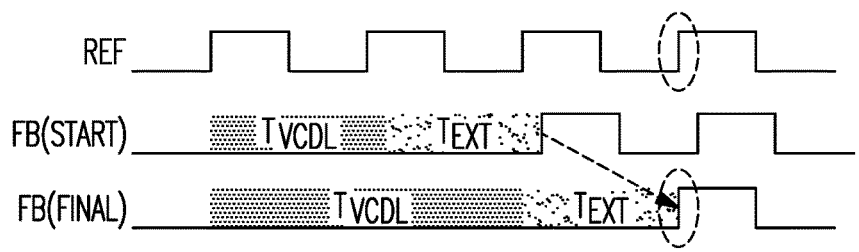
FIG. 5B is a second example of a timing diagram for a DLL.
Figure 5C:
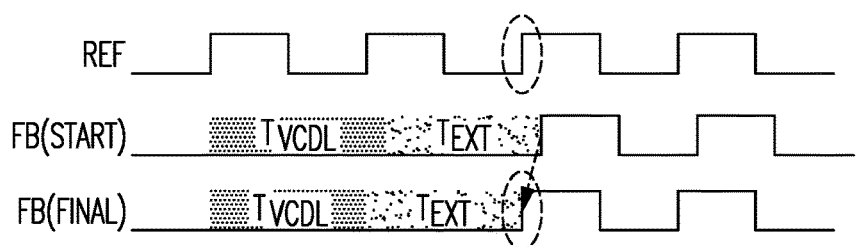
FIG. 5C is a third example of a timing diagram for a DLL.
Figure 5D:
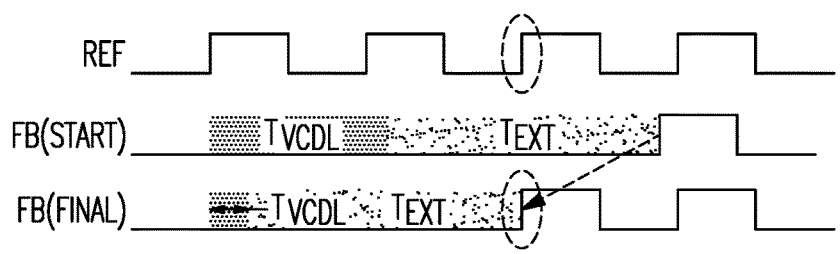
FIG. 5D is a fourth example of a timing diagram for a DLL.

FIG. 5A is a first example of a timing diagram for a DLL.
FIG. 5B is a second example of a timing diagram for a DLL.
FIG. 5C is a third example of a timing diagram for a DLL.
FIG. 5D is a fourth example of a timing diagram for a DLL.

For certain DLL applications, such as dual DLL timing alignment systems for time of flight, the length of external delay (or un-controlled delay, or feedback path delay) between VCDL1/VCDL2 to FB1/FB2 (marked as $T_{EXT}$) with respect to the $T_{VCDL}$ is not very well defined.

For example, in applications with multiple feedback path options for a DLL and/or varying signal frequency, $T_{EXT}$ could be from one half to a few times of the input clock periods.

With reference back to FIGS. 3A to 3D, for a basic type-I DLL 50, the inputs of the PFD 43 and the VCDL 47 are the same clock signal. Additionally, as shown in FIG. 3A, the DLL 50 includes a PFD/CP/LF path (through the PFD 43, the up current source 44/down current source 45, and loop capacitor 46, in this example) and a signal propagation path from REF to FB nodes. FIG. 3B shows the type-I DLL 50 locked, in which the total signal propagation delay $T_{LOOP}$ (the sum of $T_{VCDL}$ and $T_{EXT}$) is one input clock cycle period, and $T_{EXT}$ is much shorter than $T_{VCDL}$ such that the $T_{VCDL}$ delay range variation capacity to cope with $T_{EXT}$ spread is well bounded and the constraints on the VCDL 47 are low. In contrast, FIG. 3C depicts a scenario in which $T_{EXT}$ is more than one input clock period, such that the feedback signal FB is locked with a few clock periods delay of the input signal REF, referred to as harmonic locking as shown in FIG. 3C. FIG. 3D is a slightly different scenario where the PFD period $T_{PFD}$ is an integer multiple of the input signal period $T_{REF}$, and $T_{PFD}=T_{LOOP}$.

For such a DLL to lock from a give initial condition (for instance, the time relationship between the REF and FB), the VCDL delay $T_{VCDL}$ can be increased or decreased such that FB can move towards the next or the previous REF signal. FIGS. 5A to 5D depict various DLL timing diagrams depicting how the design of a PFD and/or frequency divider can control the preferred moving direction associated with lock. For example, if it is desired for FB to lock to the next REF clock, the $T_{VCDL}$ length could be increased by a range from a small amount to about a signal period as shown in FIG. 5A and FIG. 5B. However, if it is desired for FB to lock to the previous REF clock, the $T_{VCDL}$ could be reduced by a range from a small amount to about one signal cycle, as shown in FIG. 5C and FIG. 5D Absent compensation for $T_{EXT}$, $T_{VCDL}$ range could vary by one input clock cycle depending on the initial $T_{LOOP}$. For example, $T_{VCDL}$ can include a chain of cascaded unit delay cell with the delay of $T_{TAP}$, such that $T_{VCDL}=N \times T_{TAP}$, where N is the number of delay cells. If the desired $T_{TAP}$ of the VCDL is too long it is likely to result in runt pulses (pulse width is too narrow or wide) or the signal may even disappear through the delay line, particularly at higher frequency, when the input clock duty cycle is not 50%, and/or when the unit delay cell has unequal rising/falling time. Conversely, if the desired $T_{TAP}$ of the VCDL needs to be too short, the unit delay cells may saturate and not reach the desired short delay. In a laser driver application (for instance, for time of flight), this issues worsens when $T_{EXT}$ increases during operation due to self-heating of the laser driver and a corresponding desire for $T_{VCDL}$ to further decrease after the DLL has initially locked.

Although more delay cells can be increased to widen $T_{TAP}$ range (for instance, increasing N, and allow it to pass multiple signal periods), such an approach is also susceptible to runt pulse phenomenon with longer delay chain especially when the DLL's feedback loop is increasing the delay of $T_{TAP}$ from a certain point.

Figure 6:
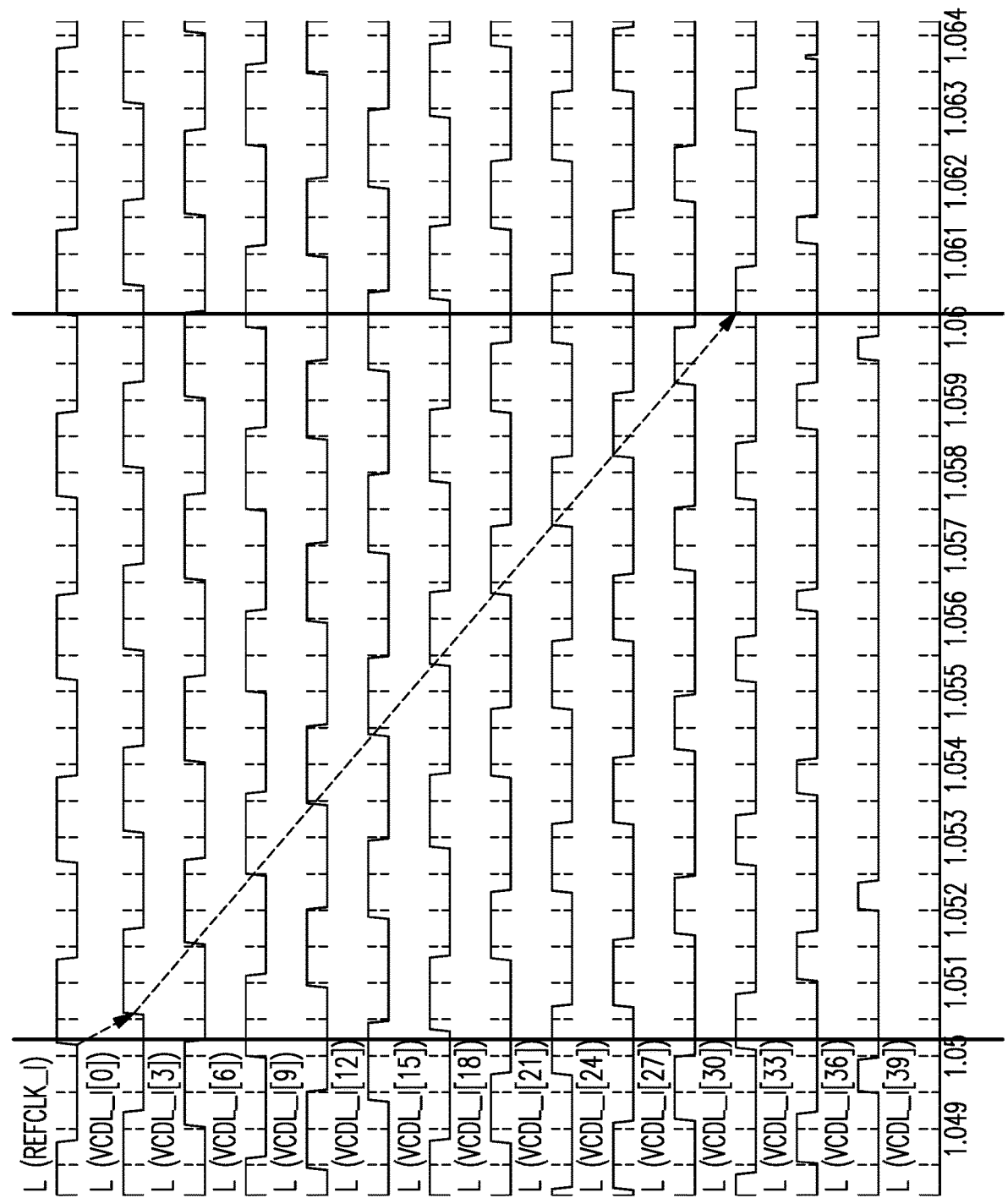
FIG. 6 depicts one example of simulation results for a runt pulse through a DLL.

FIG. 6 depicts one example of simulation results for a runt pulse through a DLL. The simulation results correspond to a simulation of a 400 MHz, 0.45% duty cycle input signal passing through a VCDL with unit cell propagation delay about 312.5 ps and only 10 ps rise/fall time difference. As shown in FIG. 6, the delay chain struggles to pass 4-5 cycles.

In additional to the functional robustness issue, even if a carefully designed DLL without calibration manages to lock, it still suffers from performance issues.

For example, firstly, the VCDL control voltage (VCTRL) or the charge pump output voltage range is expected to vary to cover the required $T_{TAP}$ range to compensate $T_{EXT}$, this varies the gain of the VCDL, and hence the loop bandwidth. This in turn results in wide spread of locking time, temperature tracking and spread spectrum capability. Although the charge pump current could be designed to be correlated to the control voltage VCTRL, it is not clear that this can always guarantee the bandwidth robustly over the entire delay range for all VCDL implementations.

Secondly, large VCTRL could cause more locking error spread. For example, a DLL's locking error is a function of the charge pump up/down current mismatch, the PFD's anti-backlash pulse width, the charge pump's leakage current, and the sampling frequency, as shown by the two equations below. Wide spread of the charge pump output voltage could cause the charge pump up/down current mismatch and the leakage current variation, hence increase the spread of the locking error.

$$|t_{e\_leakage}|[\text{sec}] = T_{ref} \cdot \frac{I_{leak}}{I_{cp}}$$

$$|t_e|[\text{sec}] = T_{on} \cdot \frac{\Delta I_{cp}}{\min(I_{cp\_up}, I_{cp\_dn})}$$

Moreover, even if the VCDL and charge pump are carefully designed and optimized to allow a single DLL to be functional, a dual PLL timing alignment system provides additional complexities.

For example, for the time of flight system of 30 of FIG. 2, two sets of PFD/CP/LF and VCDL blocks are included to align both rising and falling edges. One set aligns the rising edges of the reference and feedback clock signals, and the other set aligns the falling edges (or equivalently, the rising edges of the complementary signals for a differential signal system). As shown in FIG. 2, at the output of the two VCDLs of the DLLs 12, there is an edge combiner that generates rising and falling edges triggered by the two VCDLs' output edges respectively.

Depending on the initial status (for instance, the timing relationships of REF1/FB1 and REF2/FB2), the dual edge loop may fail to operate.

Figure 7:
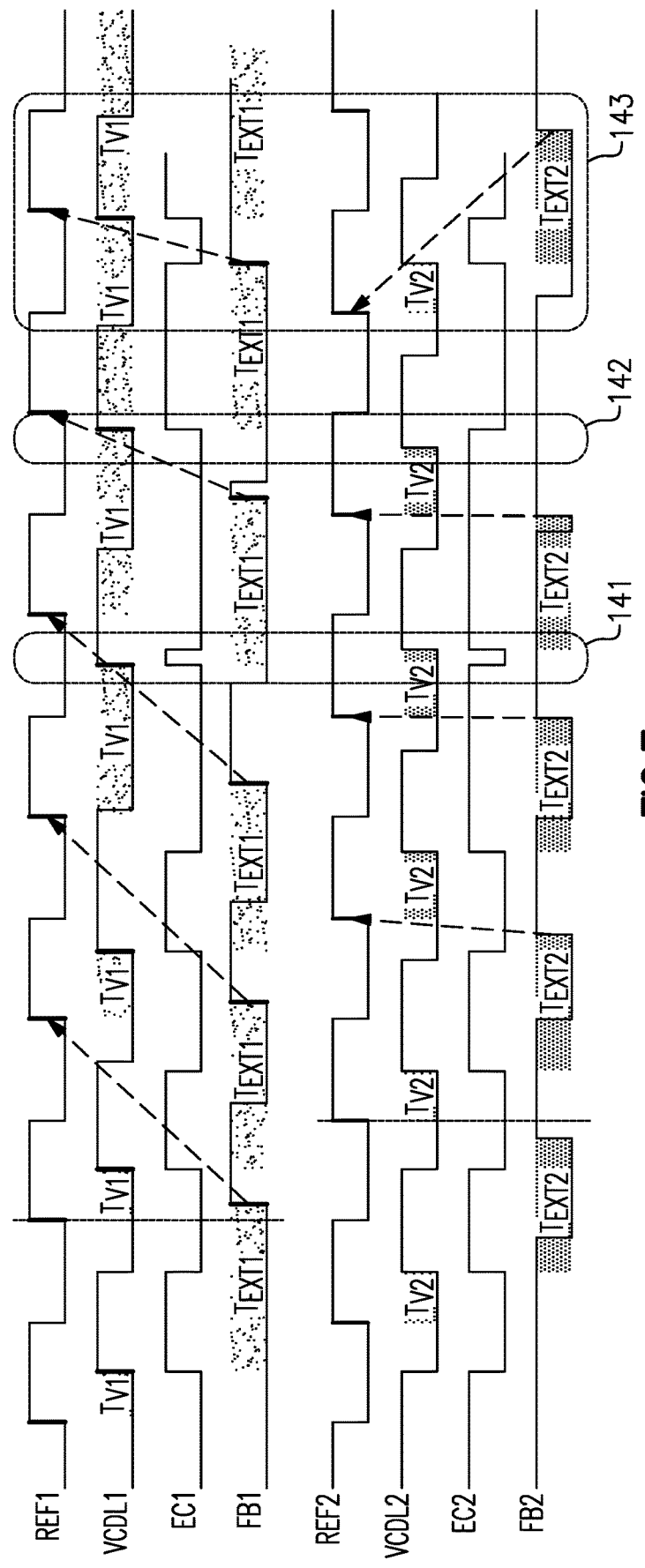
FIG. 7 is one example of a timing diagram for a dual DLL timing alignment system.

FIG. 7 is one example of a timing diagram for a dual DLL timing alignment system. As shown at the start of FIG. 7, $T_{V1}$ (the VCDL1's $T_{VCDL}$) is the same as $T_{V2}$, but the external delay $T_{EXT1}$ and $T_{EXT2}$ may not be the same. In this case, when $T_{EXT1}$ and $T_{EXT2}$ are slightly different such that FB1 and FB2 are at two sides of REF1 and REF2, respectively, the two DLL loops would behave differently. In this example, FB1 needs to move over almost one signal period while the FB2 only needs to move slightly. At some point, the DLL2 is locked and the DLL1 is still moving, later on the VCDL1 edge will be moved very close to the VCDL2 edge, the edge combiner either fails to operate or generates very narrow pulses, as shown in the first box 141 of FIG. 7. Moreover, even if the DLL and edge combiner are still functional by some chance, as the VCDL1 going past the VCDL2 edge, there will be a missing FB2 edge as shown in the second box 142 of FIG. 7. The result is that the DLL2 will start to move in a wrong direction from the next cycle as shown in the third box 143 of FIG. 7, and the DLL fails to lock properly in this scenario. This is similar to a cycle slip phenomenon in a PLL, but unlike PLLs, the VCDL in a DLL cannot recover from this situation. Although dividing down the PFD frequency can provide some help, dividing the PFD frequency also leads to more stringent range requirement for each DLL's VCDL and causes reliability issues.

Figure 8:
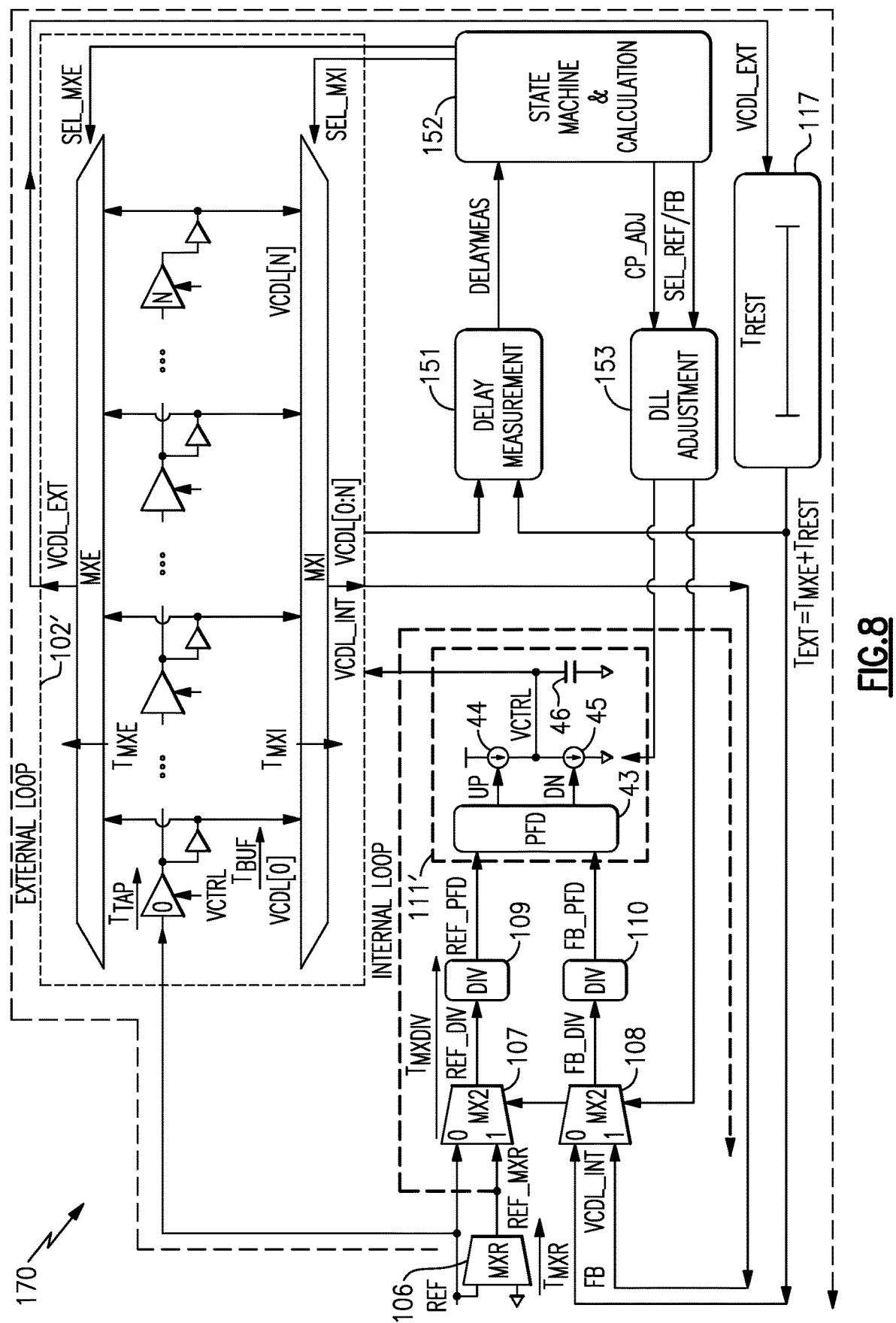
FIG. 8 is a schematic diagram of a DLL with calibration according to another embodiment.

FIG. 8 is a schematic diagram of a DLL 170 with calibration according to another embodiment. The DLL 170 includes a VCDL 102', which includes a main delay chain (corresponding to a cascade of controllable delay cells with a delay controlled by VCTRL, in this embodiment) and two multiplexers MXI and MXE for outputting the signal from a selected controllable delay cell. The DLL 170 further includes a multiplexer stage 106, a reference clock multiplexer 107, a feedback clock multiplexer 108, a reference divider 109, a feedback divider 110, a PFD/CP/LF 111' (including PFD 43, up current source 44, down current source 45, and loop capacitor 46), a delay measurement circuit 151, a state machine and calculation circuit 152, a DLL reconfiguration or adjustment circuit 153, and a delay circuit 117. Although one example of a DLL is shown, the teachings herein are applicable to DLLs implemented in a wide variety of ways including to other implementations of analog DLLs as well as to digital DLLs. Accordingly, other implementations of DLLs are possible.

The self-calibrated DLL 170 of FIG. 8 operates with a three-step calibration.

The first step is to configure the DLL 170 to lock to its own VCDL output, as indicated by the internal loop in FIG. 8. To form this internal loop, the multiplexer 107 selects REF_MXR, which is the REF signal delayed by the multiplexer stage 106, while the multiplexer 108 selects VCDL_INT, which is the internal VCDL propagation delay plus a delay of an internal loop multiplexer stage (MXI). The output of each buffered VCDL stage is called VCDL[x]. MXR is a replica multiplexer of MXI (internal multiplexer) and MXE (external multiplexer), which can be implemented as two identical (replica) multiplexers that select which VCDL[x] node to pass to the outputs, VCDL_INT and VCDL_EXT, independently. When the input signal frequency is known, one can choose to program VCDL number of delay cells to allow $T_{TAP}$ to be roughly the same for all frequencies shown in the equation below.

$$T_{VCDL}[\text{sec}] = T_{REF}[\text{sec}] = N \times T_{TAP}[\text{sec}]$$

For example, if $T_{TAP}$=260 ps, we need roughly 24 stages to for a 160 MHz signal (period=6.25 ns) or 48 stages for an 80 MHz signal (12.5 ns). Also note that the VCDL gain is proportional to the number of taps as shown in the equation below, where $K_{VCDL}$ is the total gain through the delay line and $K_{TAP}$ is the gain of a single delay cell.

$$K_{VCDL}[\text{sec/V}] = N \times K_{TAP}[\text{sec/V}]$$

So if the unit delay cell is fixed, the loop bandwidth is constant for all frequencies as the equation shown below.

$$CLBW \text{ (Hz)} =$$

$$\frac{1}{2\pi} \times \frac{I_{cp}[A]}{C_{LF}[F]} \times \frac{K_{VCDL}[\text{sec/V}]}{T_{REF}[\text{sec}]} = \frac{1}{2\pi} \times \frac{I_{cp}[A]}{C_{LF}[F]} \times \frac{K_{TAP}[\text{sec/V}]}{T_{TAP}[\text{sec}]}$$

Frequency programming can be optionally performed here, with the goal to allow the two VCDLs' outputs lock to their inputs in a manner similar to traditional DLLs.

In certain implementations, loop bandwidth is adjusted to compensate for a change in loop bandwidth arising from an adjustment to the VCDL.

For the self-calibration purpose, MXR replicates the delay of MXI, i.e. $T_{MXI}=T_{MXR}$, such that when the VCDL loop is locked, VCDL_IN locks to REF_MXR, hence VCDL [sel_mxi] locks to ref, where sel_mxi is the number of stages plus 1 in this example because the index number starts from 0. Now one PFD period ($T_{PFD}$) is equal to the length of $T_{TAP}$*(sel_mxi+1)+$T_{BUF}$, and in practice $T_{BUF}$ is small compared with $T_{TAP}$. Thus, the impact of the $T_{BUF}$ within $T_{PFD}$ can be reasonably ignored. Now all the VCDL tap outputs, VCDL[0]~VCDL[sel_mxi] are almost evenly distributed over a PFD signal period and they form the references of the self-calibration.

Figure 9:
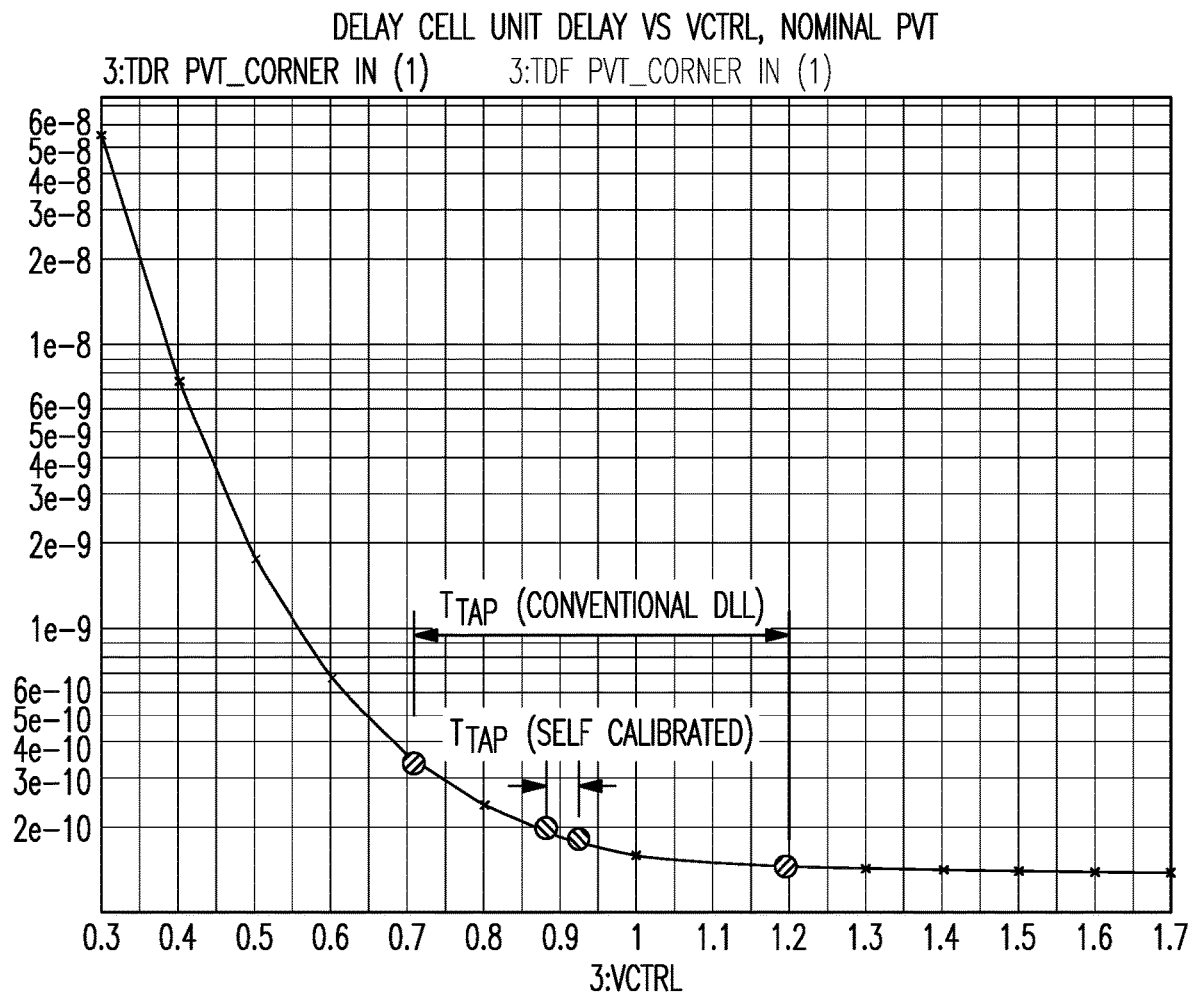
FIG. 9 is a first example of a graph of delay cell unit delay versus control voltage.

FIG. 9 is a first example of a graph of delay cell unit delay versus control voltage. The graph depicts that self-calibration of a DLL allows VCDL delay cells to operate over a narrower range of the DLL's loop control voltage relative to an implementation without such calibration.

Figure 10:
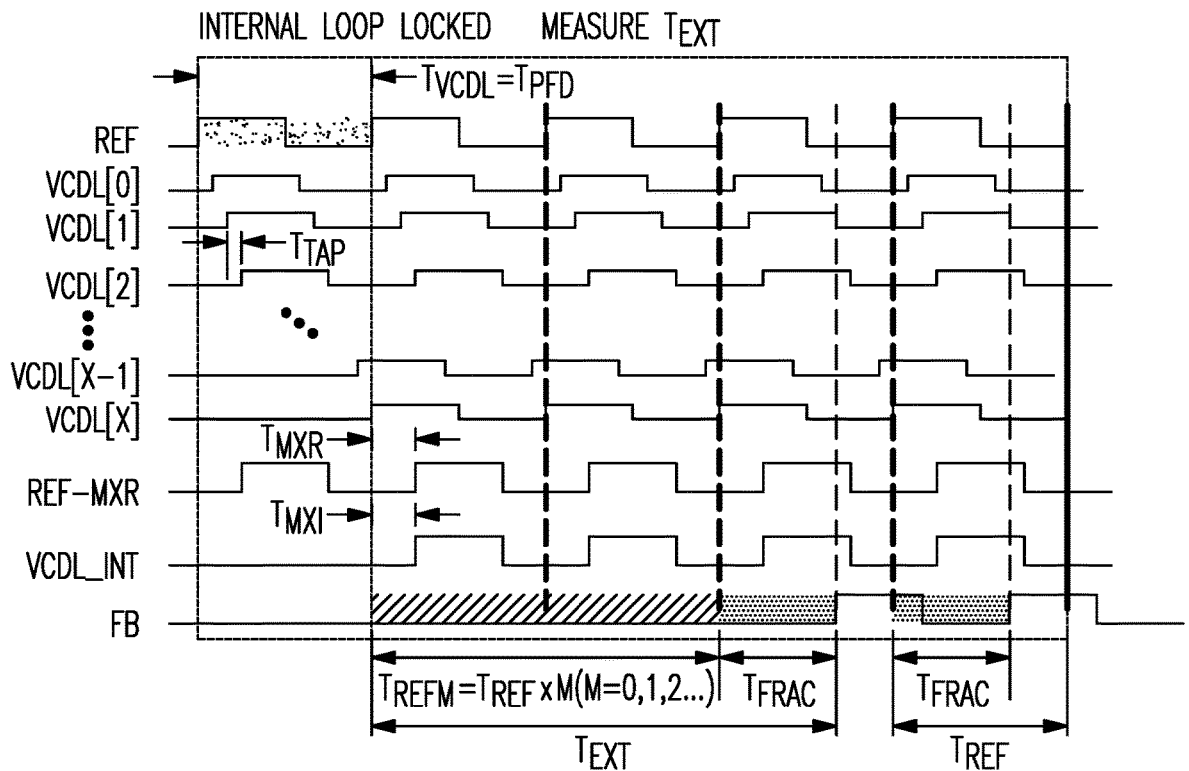
FIG. 10 is one example of a timing diagram for the DLL of FIG. 8.

FIG. 10 is one example of a timing diagram for the DLL 170 of FIG. 8. $T_{PFD}$ can be equal to $T_{REF}$ or a multiple of $T_{REF}$ depending on the frequency divider's configuration in front of the PFD. For example, see the internal loop locked section in the timing diagram shown in FIG. 10.

As shown in FIG. 10, the second step is to measure the external delay $T_{EXT}$ with a coarse time-to-digital-converter (TDC) of which the LSB roughly equals to $T_{TAP}$, in this example. As shown in the second step of FIG. 10, $T_{EXT}$ is the sum of $T_{MXE}$ and $T_{REST}$, where $T_{REST}$ is the rest of the propagation delay before FB. In certain implementations, $T_{MXE}$ and $T_{MXI}$ are about equal. Thus, MXE is enabled to allow signal to propagate to the FB node, and thereafter the length of the feedback delay using the VCDL[0]~VCDL [sel_mxi] nodes is measured.

The total length of $T_{EXT}$ is composed of $T_{REF}$×M, an integer multiple of the $T_{PFD}$ (which could be 0), and $T_{FRAC}$, the fractional delay with respect to the $T_{PFD}$. The step 2 can be enabled as early as when step 1 starts if the TDC can measure periodically, because this fraction is constant once the internal loop and external feedback nodes are stable.

Figure 11:
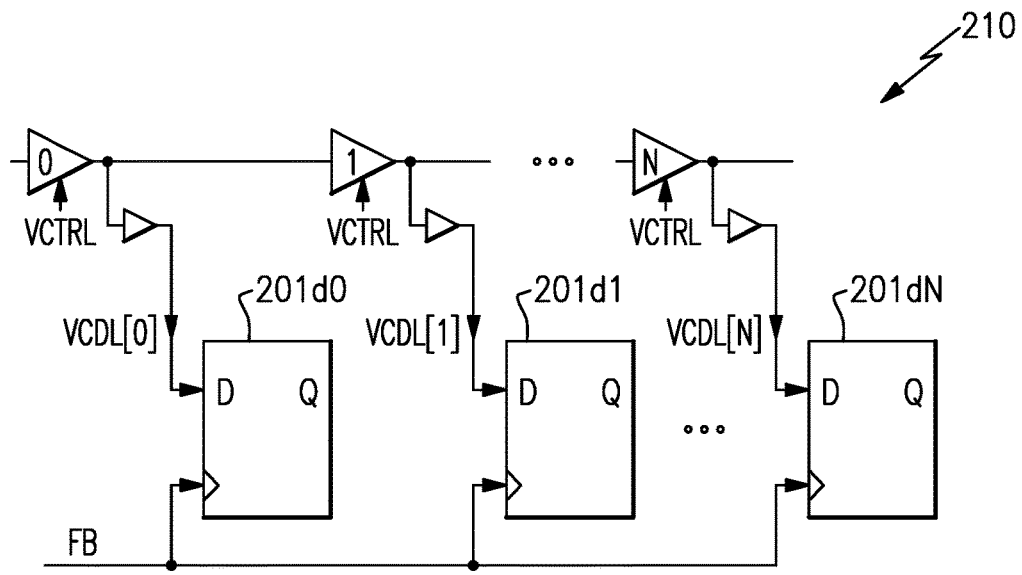
FIG. 11 is one embodiment of a time-to-digital converter (TDC).

FIG. 11 is one embodiment of a time-to-digital converter (TDC) 210.

The TDC 210 can be implemented in a wide variety of ways, including by using an array of D-flip-flops 201d0, 201d1, . . . 201dN of which the D terminals are connected to VCDL[0], VCDL[1], . . . VCDL[N] and the clock CK terminals are connected to the common node FB as shown in FIG. 11. Although one example TDC implementation is shown, TDCs can be implemented in a wide variety of ways.

The output of the TDC 210 contains the information of how long the $T_{FRAC}$ compared with $T_{PFD}$ (or $T_{REF}$ in the example shown in FIG. 10). The TDC measurement can be processed by digital circuitry to calculate an updated number of VCDL unit delay cells that changes $T_{VCDL}$, such that $T_{LOOP}$ is roughly equal to an integer number of $T_{PFD}$.

Such adjustment to the VCDL can be performed in a wide variety of ways, including number increasing or decreasing the number of unit cells, changing VCDL bias, varying VCDL's load capacitance, and/or selecting inverted phase when unit cells provide non-inverted and inverted outputs. Changing the number of delay cells scales the $K_{VCDL}$ proportionally, so an adjusted charge pump current could also be calculated accordingly to keep $I_{CP}*K_{VCDL}$ constant.

With reference to FIGS. 8 to 11, the third step is to switch from the internal loop to the external loop and allow it to lock eventually. The MXE can be first adjusted to select the correct VCDL tap to the output so that REF and FB are almost aligned, with an error limited by LSB. Note that this if this is done asynchronously, it may take some cycles for the edge combiner's output to settle. Then the multiplexer 107 and 108 switch the loop from the internal loop to the external.

Figure 12:
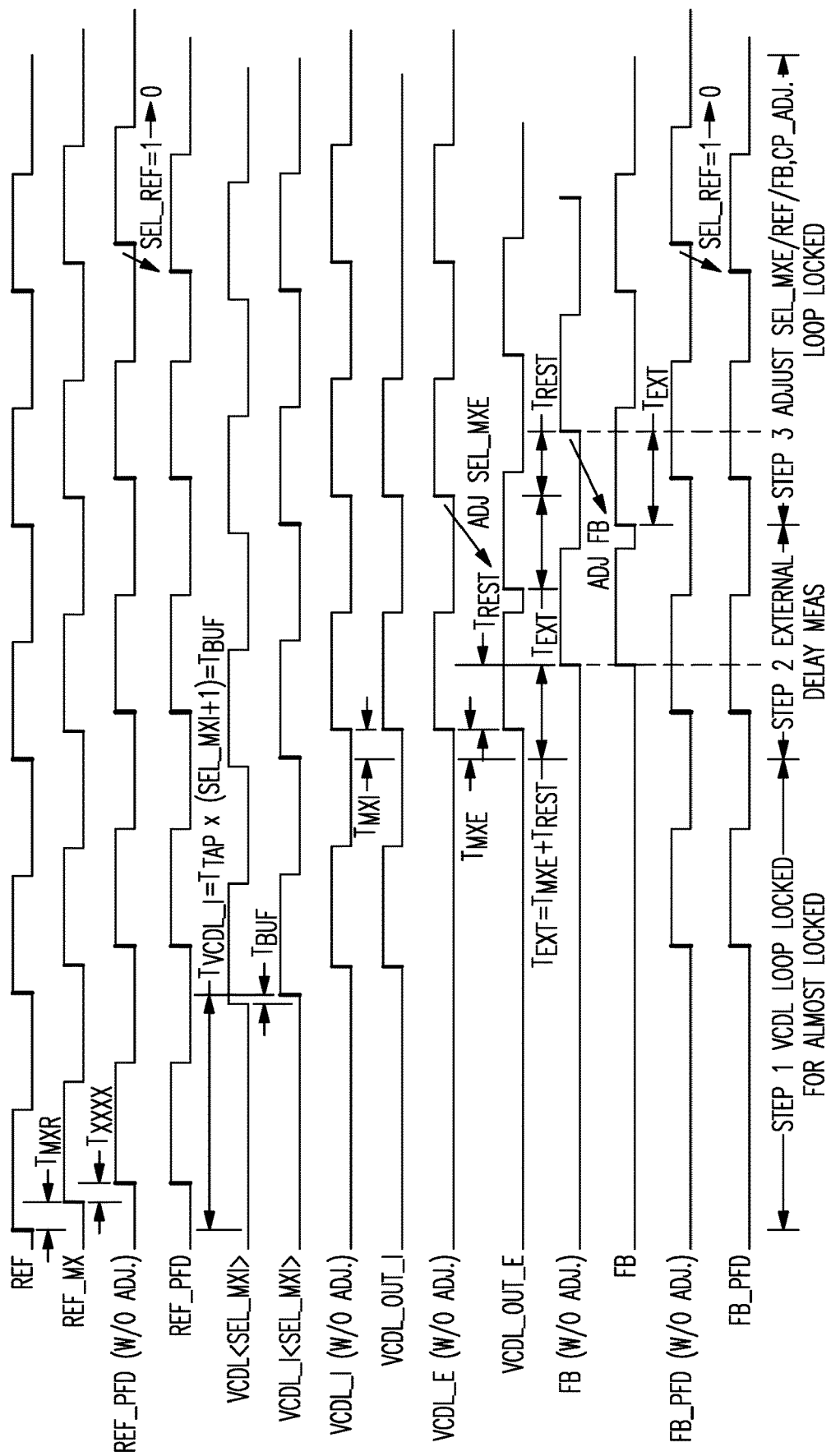
FIG. 12 is a second example of a timing diagram for the DLL of FIG. 8.

FIG. 12 is a second example of a timing diagram for the DLL 170 of FIG. 8.

Charge pump current can be switched at the same time. Because REF and FB are already close to each other, they are expected to be aligned within short period of time. FIG. 12 depicts a complete timing diagram, and shows an example of the VCDL number of cells being reduced.

Standard VCDL and PFD/CP/LF circuits can be used here to avoid extensive analog design engineering cost and risk, and to guarantee the robustness of operation and time to market. Depending on the bandwidth accuracy specification, one could choose to bias the charge pump current with the VCDL control voltage to further control the loop bandwidth. In this architecture, since the VCDL delay cells' operating point spread is tightly controlled, such benefits can be readily achieved without much difficulty.

Figure 13:
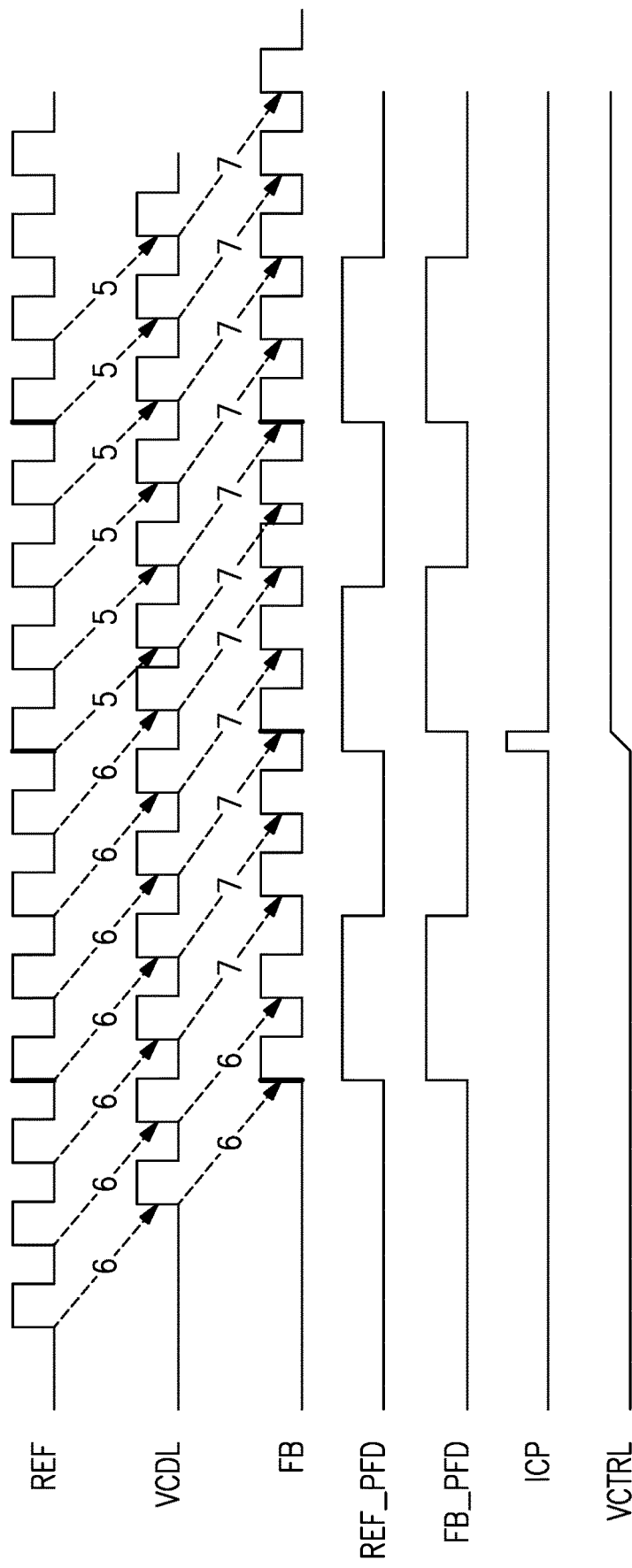
FIG. 13 is a third example of a timing diagram for the DLL of FIG. 8.

FIG. 13 is a third example of a timing diagram for the DLL 170 of FIG. 8.

One could choose to keep $T_{PFD}=T_{REF}$ to get a reasonable locking behavior. However since the $T_{LOOP}$ could be more than one $T_{PFD}$, the effect of any adjustment at a PFD sampling instance won't be propagated to the FB node within $T_{PFD}$, so the next PFD sampling instance doesn't response to the outcome of this sampling, instead it responses to one of the previous ones. This additional delay may not be desired. And for a non-ideal PFD/CP transfer function, this means the locking error could fluctuation around its mean value. In some cases this may not be a concern, but the simplest solution to improve is to configure the frequency divider in the front of the PFD to a value such that the PFD sampling interval, $T_{PFD}$, is equal to or longer than $T_{LOOP}$, as long as we can guarantee the sampling frequency is much larger than the loop bandwidth from the stability perspective, such that the PFD/CP adjustment effect is propagated to the FB node before the next sampling event.

Thus, FIG. 13 depicts an example where the $T_{LOOP}$ from REF to FB is three cycles of REF period and the PFD frequency is four times lower than the reference signal. In this example, a phase error is introduced at some point, and the DLL will response to this from the next PFD sampling event immediately. Once we do this, the charge pump current could be scaled with the sampling frequency to keep the loop bandwidth constant.

Figure 14:
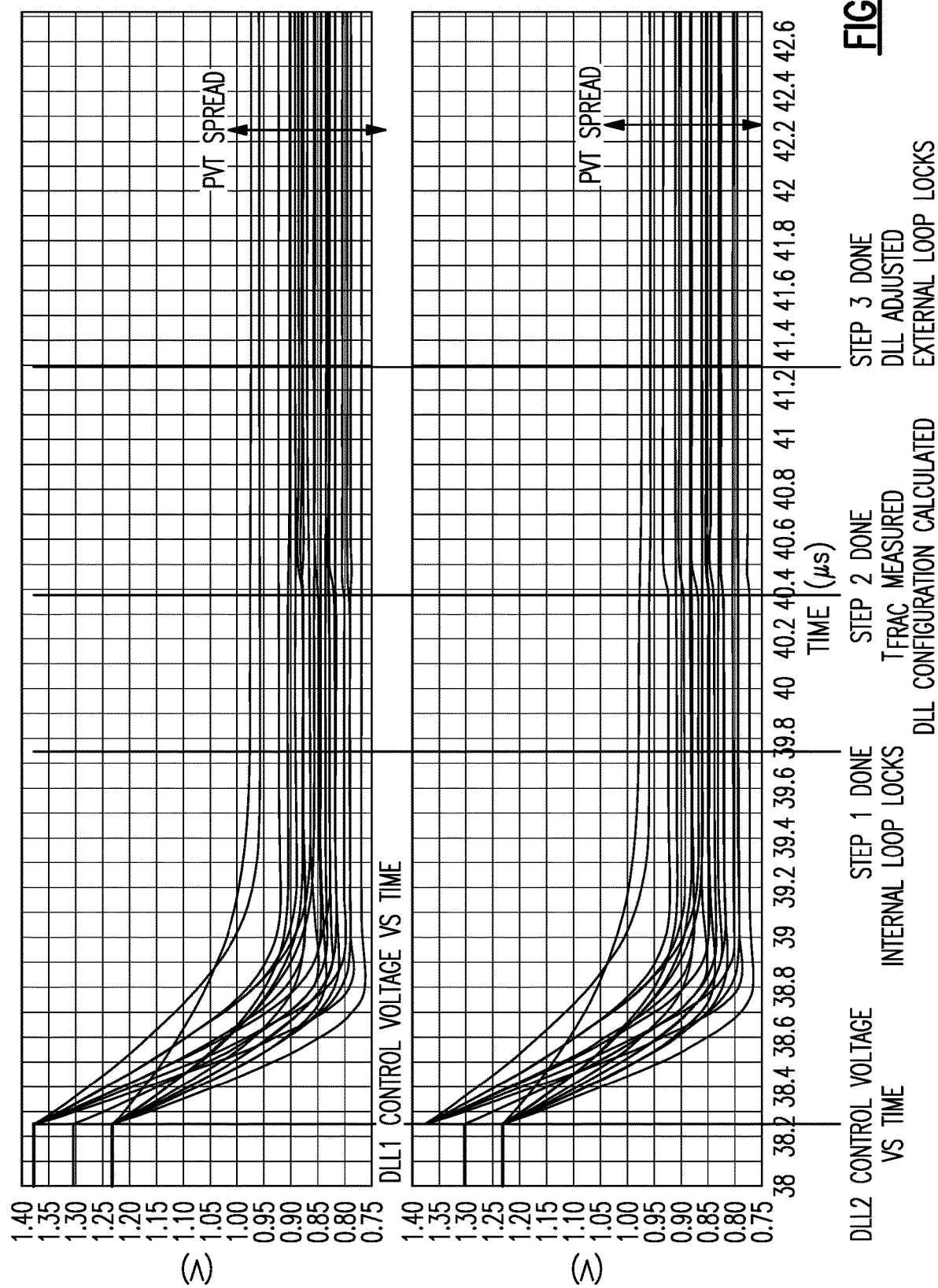
FIG. 14 is one example of a graph of control voltage versus time for a dual DLL timing alignment system.

FIG. 14 is one example of a graph of control voltage versus time for a dual DLL timing alignment system. The graph shows simulation result of VCDL control voltage versus time for DLL1 and DLL2 at 300 MHz. In step 1 and 2, the internal loop for DLL1 and DLL2 operates independently. Once the new DLL configurations are calculated, the DLLs are switched to external loops in step 3. The control voltage spread is small because any $T_{EXT}$ variation is calibrated out by the DLL itself.

Figure 15:
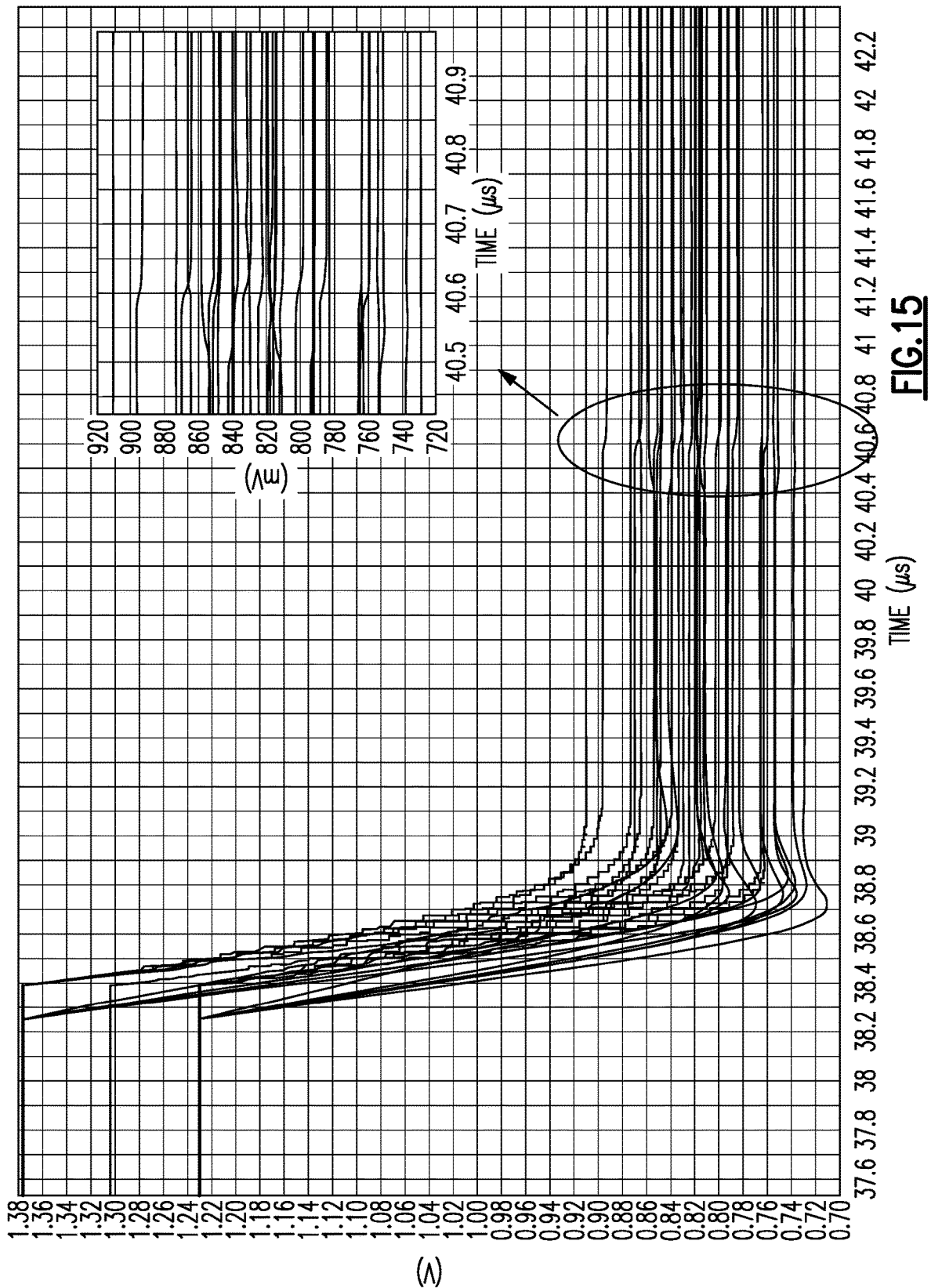
FIG. 15 is one example of a graph of DLL locking behavior.

FIG. 15 is one example of a graph of DLL locking behavior. The example DLL locking is shown for 300 MHz and 40 MHz input frequency. The final control voltage spread is the same for the two frequencies, in this example. Also note that the control voltage movement in step 3 is very small so the final locking is reasonably fast.

As shown in the example of FIG. 15, roughly the same control voltage can be locked for different frequencies, as a result of the DLL frequency programming Applications Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, automotive, radar, and aerospace applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A timing alignment system with calibration for loop delay, the timing alignment system comprising:
    a delay locked loop (DLL) comprising:
        a detector configured to generate a delay control signal based on comparing a reference clock signal to a feedback clock signal, and
        a controllable delay line configured to generate the feedback clock signal by delaying the reference clock signal based on the delay control signal; and
    a delay compensation circuit configured to provide an adjustment to the controllable delay line to compensate for a delay of the feedback clock signal in reaching the detector, wherein the adjustment to the controllable delay line changes a propagation delay of the reference signal through the controllable delay line.

2. The timing alignment system of claim 1, wherein the delay includes an integer number of reference periods and a fractional delay, wherein the delay compensation circuit includes a time-to-digital converter (TDC) configured to measure the fractional delay to determine a measured fractional delay, the delay compensation circuit configured to provide the adjustment based on the measured fractional delay.

3. The timing alignment system of claim 2, wherein the delay compensation circuit is further configured to provide the adjustment based on both the measured fractional delay and the integer number of reference periods.

4. The timing alignment system of claim 1, further comprising an external delay circuit, wherein the DLL is operable in a first mode in which the external delay circuit is bypassed, the delay compensation circuit configured to determine a measured delay through the external delay circuit when the DLL operates in the first mode, and to provide the adjustment to the controllable delay line based on the measured delay.

5. The timing alignment system of claim 4, wherein the DLL is further operable in a second mode in which the feedback clock signal propagates through the external delay circuit, the DLL configured to transition from the first mode to the second mode after the delay compensation circuit adjusts the controllable delay line.

6. The timing alignment system of claim 1, wherein the delay compensation circuit is further configured to control the loop bandwidth of the DLL based on the adjustment to the controllable delay line.

7. The timing alignment system of claim 1, wherein the DLL further includes a first divider configured to divide the reference clock signal to the detector and a second divider configured to divide the feedback clock signal to the detector, wherein the delay compensation circuit is further configured to control at least one of a division ratio of the first divider or a division ratio of the second divider based on the delay.

8. A method of calibration for external delay in a timing alignment system, the method comprising:
    generating a delay control signal based on comparing a reference clock signal to a feedback clock signal using a detector of a delay locked loop (DLL);
    generating the feedback clock signal by delaying the reference clock signal based on the delay control signal using a controllable delay line of the DLL;
    providing an adjustment to the controllable delay line to compensate for a delay of the feedback clock signal in reaching the detector using a delay compensation circuit;
    operating the DLL in a first mode in which the feedback clock signal bypasses an external delay circuit;
    determining a measured delay through the external delay circuit when the DLL operates in the first mode; and
    adjusting the controllable delay line based on the measured delay.

9. The method of claim 8 further comprising transitioning the DLL from the first mode to a second mode in which the feedback clock signal propagates through the external delay circuit.

10. The method of claim 8, wherein the delay includes an integer number of reference periods and a fractional delay, the method further comprising measuring the fractional delay using a time-to-digital converter (TDC) to determine a measured fractional delay, and providing the adjustment based on the measured fractional delay.

11. The method of claim 10, further comprising providing the adjustment based on both the measured fractional delay and the integer number of reference periods.

12. The method of claim 8, further comprising controlling the loop bandwidth of the DLL based on the adjustment to the controllable delay line.

13. The method of claim 8, further comprising dividing the reference clock signal to the detector using a first divider, dividing the feedback clock signal to the detector using a second detector, and setting at least one of a division ratio of the first divider or a division ratio of the second divider based on the delay.

14. The method of claim 8, wherein adjusting the controllable delay line comprises changing a propagation delay of the reference signal though the controllable delay line.

15. A time of flight system comprising:
a receiver configured to provide a reference clock signal;
a driver circuit configured to generate a driver signal; and
a timing alignment system comprising a delay-locked loop (DLL) configured to control timing of the driver signal based on the reference clock signal, the delay-locked loop including a detector configured to generate a delay control signal based on comparing a reference clock signal to a feedback clock signal, and a controllable delay line configured to generate the feedback clock signal by delaying the reference clock signal based on the delay control signal, wherein the timing alignment system further comprises a delay compensation circuit configured to provide an adjustment to the controllable delay line to compensate for a delay of the feedback clock signal in reaching the detector, and an external delay circuit, wherein the DLL is operable in a first mode in which the external delay circuit is bypassed, the delay compensation circuit configured to determine a measured delay through the external delay circuit when the DLL operates in the first mode, and to provide the adjustment to the controllable delay line based on the measured delay.

16. The time of flight system of claim 15, wherein the DLL is further operable in a second mode in which the feedback clock signal propagates through the external delay circuit, the DLL configured to transition from the first mode to the second mode after the delay compensation circuit adjusts the controllable delay line.

17. The time of flight system of claim 15, further comprising a pair of DLLs configured to measure a rising edge and a falling edge of the reference signal, wherein the DLL corresponds to one of the pair of DLLs.

18. The time of flight system of claim 15, wherein the delay includes an integer number of reference periods and a fractional delay, wherein the delay compensation circuit includes a time-to-digital converter (TDC) configured to measure the fractional delay to determine a measured fractional delay, the delay compensation circuit configured to provide the adjustment based on the measured fractional delay.

19. The time of flight system of claim 15, wherein the delay compensation circuit is further configured to control the loop bandwidth of the DLL based on the adjustment to the controllable delay line.

20. The time of flight system of claim 15, wherein the DLL further includes a first divider configured to divide the reference clock signal to the detector and a second divider configured to divide the feedback clock signal to the detector, wherein the delay compensation circuit is further configured to control at least one of a division ratio of the first divider or a division ratio of the second divider based on the delay.

* * * * *